United States Patent
Regnier et al.

(10) Patent No.: US 7,022,595 B2
(45) Date of Patent: Apr. 4, 2006

(54) METHOD FOR THE SELECTIVE FORMATION OF A SILICIDE ON A WAFER USING AN IMPLANTATION RESIDUE LAYER

(75) Inventors: Christophe Regnier, Saint Hilaire Du Touvet (FR); François Wacquant, Saint Ismier (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/871,356

(22) Filed: Jun. 18, 2004

(65) Prior Publication Data

US 2005/0064638 A1    Mar. 24, 2005

(30) Foreign Application Priority Data

Jun. 20, 2003   (FR) .................................. 03 07474

(51) Int. Cl.
*H01L 21/3205* (2006.01)

(52) U.S. Cl. ...................... 438/592; 438/279; 438/286; 438/655

(58) Field of Classification Search ................ 438/279, 438/286, 520, 528, 592, 652, 655
See application file for complete search history.

(56) References Cited

U.S. PATENT DOCUMENTS

| | | | |
|---|---|---|---|
| 4,729,969 A | 3/1988 | Suda et al. .................. 437/200 |
| 4,861,732 A * | 8/1989 | Fujimura et al. ............ 438/704 |
| 5,258,637 A | 11/1993 | Sandhu et al. .............. 257/384 |
| 5,705,441 A | 1/1998 | Wang et al. ................. 438/384 |
| 6,001,737 A | 12/1999 | Horiuchi et al. ............ 438/683 |
| 6,004,871 A | 12/1999 | Kittl et al. ................... 438/592 |
| 6,255,179 B1 | 7/2001 | Cantell et al. .............. 438/301 |
| 6,281,556 B1 | 8/2001 | Gerritsen et al. ........... 257/382 |
| 6,326,289 B1 * | 12/2001 | Rodder et al. .............. 438/592 |
| 2002/0064918 A1 | 5/2002 | Lee et al. .................... 438/300 |
| 2002/0098689 A1 | 7/2002 | Chong et al. ............... 438/655 |
| 2002/0155690 A1 | 10/2002 | Cabral, Jr. et al. .......... 438/596 |

FOREIGN PATENT DOCUMENTS

WO    WO 00/36634    6/2002

* cited by examiner

*Primary Examiner*—Jack Chen
(74) *Attorney, Agent, or Firm*—Lisa K. Jorgenson; Hai Han; Seed IP Law Group PLLC

(57) ABSTRACT

A method for the selective formation of a suicide on a slice of semiconductor material that comprises exposed regions to be silicided and exposed regions not to be silicided, comprising the following steps: a) forming a resist thin mask on top of the regions not to be silicided; b) implanting ions wafer-scale through said mask so as to form beneath the resist layer an implantation residue layers using the resist layer; c) removing the resist layer; d) depositing conformally a metal layer on the wafer; e) performing rapid heat treatment so as to form a silicide by siliciding the metal deposited at step d); and f) removing the metal that has not reacted to the heat treatment of step e).

20 Claims, 2 Drawing Sheets

Figure 1:
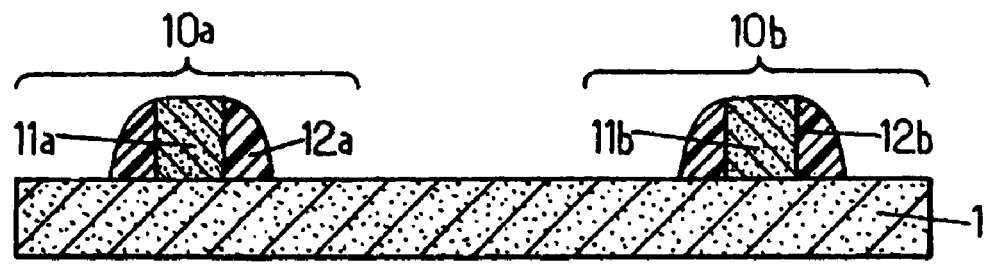

METHOD FOR THE SELECTIVE FORMATION OF A SILICIDE ON A WAFER USING AN IMPLANTATION RESIDUE LAYER

BACKGROUND OF THE INVENTION

1. Field of the Invention

The present invention relates to a method for the selective formation of a silicide on a slice of semiconductor material (wafer) comprising exposed regions to be silicided and exposed regions not to be silicided.

The invention is applicable especially in the fabrication of MOS (Metal Oxide Semiconductor) transistors in all technologies that use silicides, particularly 0.18-µm, 0.12-µm, 90-nm or 65-nm technologies.

2. Description of the Related Art

MOS transistors are important components of semiconductor devices and the electrical performance of the gate of MOS transistors directly affects the quality of these devices. The gate region of an MOS transistor typically comprises a polycrystalline silicon (polysilicon) layer or an amorphous silicon layer used as main conducting layer, and sometimes a silicide layer, for example a layer of cobalt (Co) silicide, stacked on the main conducting layer. Likewise, the source and drain active regions of an MOS transistor comprise a doped silicon layer that may be covered with a silicide layer. These silicide layers provide good ohmic contact and consequently reduce the layer resistances of the MOS transistor and increase the operational speed of the semiconductor device that incorporates it.

Depending on the requirements of the application, it may thus be necessary to silicide the gate, drain and/or source regions of certain MOS transistors and not to silicide the corresponding regions of the other transistors produced on the wafer. This is because it may be necessary, for example, to reduce the contact resistances of certain transistors, while on the contrary to protect certain other transistors from electrostatic discharges by a high contact resistance.

In the prior art, it is conventional to use a mask for preventing a silicide forming on the regions not to be silicided. This mask may be formed from a stack comprising, on the one hand, an oxide layer, for example a layer of silicon dioxide ($SiO_2$) obtained by CVD (Chemical Vapor Deposition) from tetraethyl orthosilicate (TEOS) and, on the other hand, a nitride layer, for example a layer of silicon nitride ($Si_3N_4$). Such a mask is sometimes called a "Si-Protect" mask in the jargon of those skilled in the art. The silicide does not form on the regions protected by this mask.

However, the formation of such a mask requires a thermal budget that is not very compatible with the junctions in 90 nm technology and in smaller technology. In addition, it generates stresses in the MOS transistors. Finally, it requires in itself a relatively large number of steps. In particular, it requires a deoxidation step before deposition of the cobalt (Co) in order to remove the $SiO_2$ stop layer, which step results in an undesirable hollowing-out of the STI (Shallow Trench Isolation) trenches.

BRIEF SUMMARY OF THE INVENTION

One embodiment of the invention provides a method for the selective formation of a silicide on a slice of semiconductor material that alleviates the aforementioned drawbacks of the prior art.

In particular, one embodiment of the present invention provides a method for the selective formation of a silicide on a slice of semiconductor material that comprises exposed regions to be silicided and exposed regions not to be silicided, the method comprising the following steps:

a) forming a resist layer on top of the regions not to be silicided;

b) implanting ions, preferably non-dopant ions, through said resist layer;

c) removing the resist layer;

d) depositing a metal layer on the slice, said metal being capable of forming a silicide by thermal reaction with the silicon;

e) performing a heat treatment suitable for siliciding the metal deposited at step d); and f) removing the metal that has not reacted to the heat treatment of step e).

During the implantation of step b), a compound forms beneath the resist portions, which withstands the chemical etching operations commonly employed in microelectronics for removing the resist. This compound, or implantation residue, results from the implantation of resist within the subjacent silicon, this resist being entrained with the implanted ions. Such a phenomenon is well known per se, but is usually regarded as a drawback since the implantation residue thus formed may be the source of a silicide cut (or "salicide" cut). The present invention therefore proposes an astute use of this phenomenon to solve the problem posed.

Advantageously, step a) of forming a resist layer may be accomplished with a thermal budget compatible with the technologies for fabricating 90-nm and smaller MOS transistors. Moreover, it generates no stress in the MOS transistors. Furthermore, the process according to the present invention reduces the number of steps needed for selective siliciding, as it may be incorporated into the usual procedure for fabricating MOS transistors.

BRIEF DESCRIPTION OF THE SEVERAL VIEWS OF THE DRAWING(S)

Other features and advantages of the invention will become more apparent on reading the description that follows. This is purely illustrative and must be read in conjunction with the appended drawings, in which:

FIGS. 1 to 7 are sectional views illustrating the steps of one example of how the process according to the present invention may be implemented.

DETAILED DESCRIPTION OF THE INVENTION

In the drawings, identical elements bear the same references. Each figure shows a portion of a wafer comprising a silicon substrate 1 on which portions of material forming the respective gates of two adjacent transistors have been deposited.

In the left-hand part of FIG. 1, a transistor 10a comprises a gate region 11a attached to the surface of the substrate 1 and surrounded by a portion 12a forming the spacer for the gate. Likewise, in the right-hand part of the figure, another transistor 10b comprises an attached portion 11b that forms the gate region of the transistor and is surrounded by an attached portion 12b forming the spacer for this transistor. The substrate 1 also comprises active regions obtained by the implementation of dopants on either side of the gate of each of the transistors 10a and 10b, corresponding to the source and drain regions (not shown) of these transistors.

It will be assumed here that the gate 11a and the active regions of the transistor 10a must be silicided while preventing the formation of a silicide on the corresponding regions of the transistor 10b. One method of implementing the selective siliciding process according to the invention, which allows this result to be obtained, will now be described.

Figure 2:
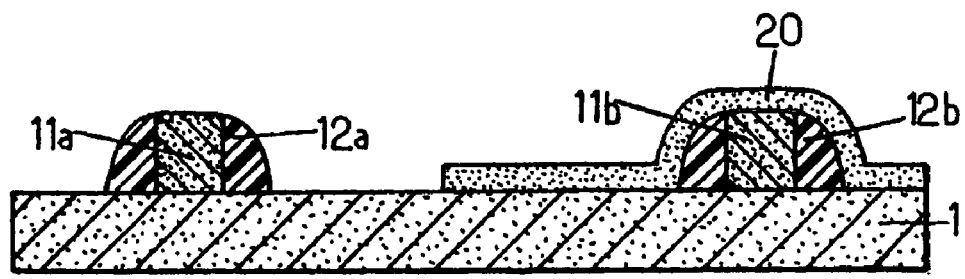

In the first step, illustrated by the diagram in FIG. 2, a resist layer 20, for example an organic resin, is formed on top of the transistor 10b. This layer 20 forms a thin mask obtained for example by a conventional photolithography process. It seems unnecessary to explain in detail here the various steps leading to the formation of this layer 20. It will simply be noted that, after this first step, the resist covers those regions of the wafer that are not be silicided. The thickness of the layer 20 may be between 50 nm and 400 nm.

Figure 3:
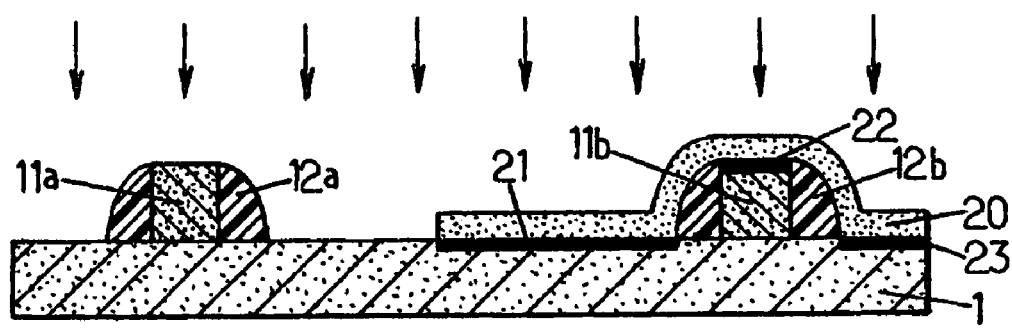

The second step, illustrated by the diagram in FIG. 3, involves the wafer-scale implantation of ions into the substrate 1, through the resist layer 20, for example by bombarding the wafer with a corresponding ion beam. The choice of implantation conditions is determined directly by the nature and the thickness of the resist layer and the nature of the implanted ions.

Preferably, these are non-dopant ions, thereby allowing this implantation step not to modify the doping of the active regions of the transistors, and therefore to leave the electrical properties of the transistors intact. Non-dopant ions are, for example, ions of a substance having the same valency as the substrate 1, for example germanium (Ge) ions. In a variant, the ions are of a rare gas such as xenon (Xe) or argon (Ar).

However, dopant ions with a low dose may also be used without irreversibly disturbing the underlying architecture.

This implantation step thus results in the formation of a compound beneath the resist layer 20, in the upper part of the silicon portions located beneath this layer. Portions 21 and 23 are thus formed in the upper part of the source and drain regions of the transistor 10b, as is a portion 22 of this compound in the upper part of the gate region 11b of the transistor 10b. This compound results from the implantation of some of the material forming the resist layer 20 into the subjacent silicon.

Figure 4:
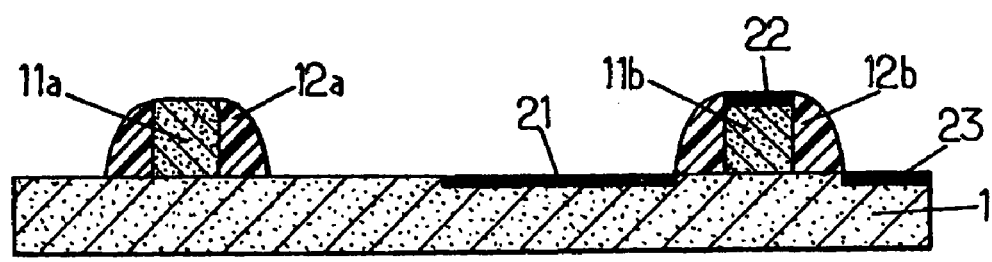

In the next step, the remaining part of the resist layer 20 is removed in such a way as to obtain the structure illustrated by the diagram in FIG. 4. After this step, the regions not to be silicided are again exposed.

This removal step may be carried out by any known method, especially by chemical etching. As illustrated, this removal leaves the compound portions 21, 22 and 23 intact, since this compound is resistant to the chemical etching commonly used in microelectronics, especially etching by an oxidizing plasma or by HF.

The standard steps of a siliciding process are then carried out.

Figure 5:
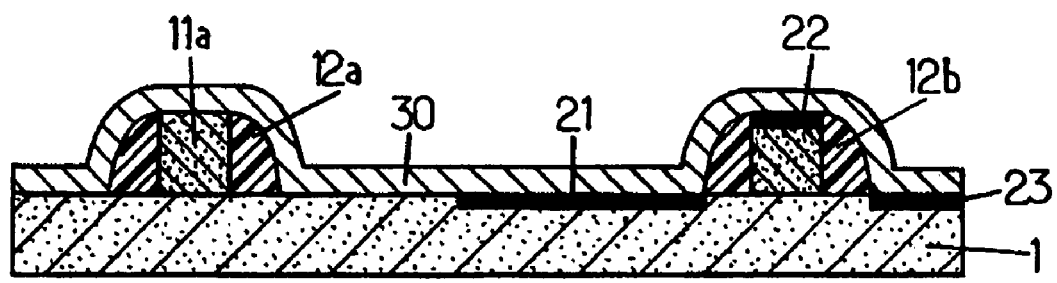

Firstly, a metal layer 30 is deposited on the structure, the said metal being suitable for forming a silicide by thermal annealing. As illustrated in FIG. 5, the layer 30 is a conformal layer that covers all the exposed parts of the structure, in particular the gate, source and drain regions of the two transistors 10a and 10b. In other words, the metal layer covers both the regions to be silicided and the regions not to be silicided.

This deposition may be carried out by any conventional process, especially by a process of sputtering.

Metals that have the property of reacting with silicon in order to form a silicide, thus forming good candidates since they have well-controlled deposition processes, are especially Co, nickel (Ni), platinum (Pt) and titanium (Ti). Their corresponding silicides are $CoSi_2$, NiSi, PtSi and $TiSi_2$, respectively.

Figure 6:
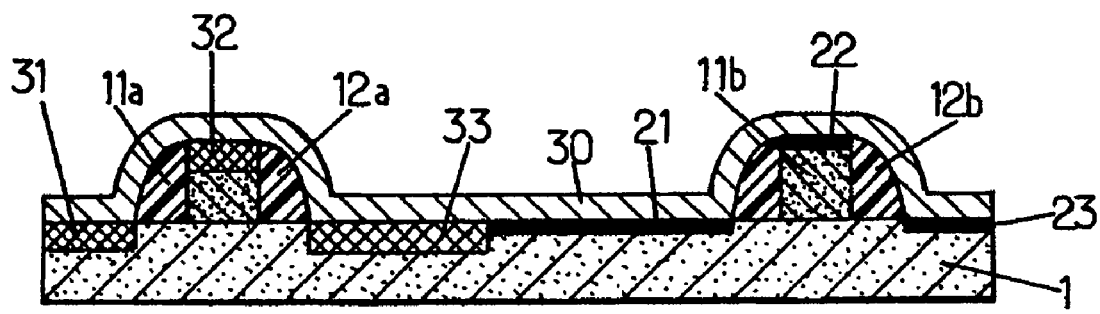

In the next step, illustrated by the diagram in FIG. 6, a heat treatment, for example an RTP (Rapid Thermal Processing) heat treatment, i.e., a heating step, is carried out. This heating step results in the formation of silicide layers 31 and 33 on the surface of the source and drain regions of the transistor 10a and of a similar layer 32 on the surface of the gate region 11a of this transistor. However, the presence of the implantation residue layers 21, 22 and 23 on the corresponding regions of the transistor 10b prevents the formation of a silicide on the surface of these regions. Put another way, the implantation residue layers 21, 22 and 23 create a barrier to the formation of silicide at the interface between the metal layer 30 and the subjacent silicon portions.

Figure 7:
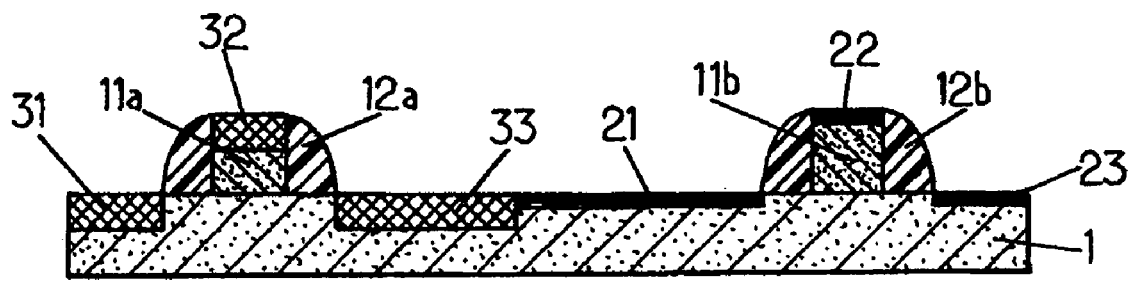

In the next step, the remainder of the metal layer 30 is removed in order to obtain the configuration shown in FIG. 7. This removal may be carried out by any conventional method, especially by chemical etching.

To summarize, the implantation of the non-dopant ions through the resist layer 20 creates a screen which then prevents the siliciding of the regions that have been beneath the resist during the said implantation. Thus the desired selected siliciding is obtained.

It should be noted that implementation of the invention can be readily detected in semiconductor devices. This is because it may be seen that the TEOS and nitride layers are absent, these layers would have remained in the unsilicided regions when a process according to the prior art described in the introduction is employed. As a variant or as a complement, it is also possible to show the presence of implantation residues in the unsilicided regions. This may be achieved by compositional analysis using SIMS (Secondary Ion Mass Spectroscopy) or using a technique for detecting impurities in the silicon, of the Auger type or the like. This analysis and this technique are well known to those skilled in the art.

The invention was described above in terms of a method of implementation given solely by way of example, it being clearly understood that other methods of implementation may be chosen without departing from the scope of the present invention.

The invention also relates to a semiconductor device obtained by implementing a process as described above.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for a selective formation of a suicide on a silicon wafer that comprises exposed regions to be silicided and exposed regions not to be silicided, the method comprising the following steps:
   a) forming a resist layer on top of the exposed regions not to be silicided;
   b) implanting ions through said resist layer, the implanting step forming an implantation residue layer in the exposed regions not to be silicided, said implantation residue layer being resistant to suicide formation;
   c) removing the resist layer;

d) depositing a metal layer on the wafer, said metal layer being capable of forming a silicide by thermal reaction with the silicon;

e) performing a heat treatment suitable for siliciding the metal layer deposited at step d); and f) removing metal portions of the metal layer that have not reacted to the heat treatment of step e).

2. A method according to claim 1 wherein the implantation of step b) is a wafer-scale implantation.

3. A method according to claim 1 wherein the ions implanted at step b) are non-dopant ions.

4. A method according to claim 3 wherein the ions implanted at step b) are selected from the group consisting of Ge, Xe and Ar ions.

5. A method according to claim 1 wherein the metal deposited at step d) is selected from the group consisting of Co, Ni, Pt and Ti.

6. A method according to claim 1 wherein the resist is an organic resin.

7. A method of forming silicide on a first region of a silicon wafer, said silicon wafer further including a second region, the method comprising:

forming a sacrificial resist layer on top of the second region;

forming an implantation residue layer in the second region by implanting ions through the sacrificial resist layer and into the second region, said implantation residual layer being resistant to silicidation;

removing the resist layer;

depositing a metal layer on the wafer; and forming suicide in the first region by reacting a portion of the metal layer with the silicon of the first region without forming silicide in the second region.

8. The method of claim 7 wherein the ions are non-dopant ions.

9. The method of claim 8 wherein the ions are Ge, Xe or Ar ions.

10. The method of claim 7 wherein the ions are dopant ions in dosages that will not affect the electrical property of the silicon wafer.

11. The method of claim 8 wherein the metal is Co, Ni, Pt or Ti.

12. The method of claim 7 wherein the implantation residue layer is formed by compounding a material of the resist layer with the silicon in the second region.

13. The method of claim 12 wherein the resist layer is an organic resin.

14. A method of forming suicide on a first region of a silicon wafer, said silicon wafer further including a second region, the method comprising:

forming a sacrificial resist layer on top of the second region;

implanting ions through the sacrificial resist layer to implant a material of the sacrificial resist layer into the silicon directly underneath the sacrificial resist layer;

depositing a metal layer on the wafer; and forming silicide in the first region by reacting a portion of the metal layer with the silicon of the first region without forming silicide in the second region.

15. The method of claim 14 wherein the step of implanting forms an implantation residue layer in the second region, said implantation residue layer being resistant to silicide formation.

16. The method of claim 14 wherein the ions are non-dopant ions.

17. The method of claim 16 wherein the ions are Ge, Xe or Ar ions.

18. The method of claim 14 wherein the ions are dopant ions in dosages that will not affect the electrical property of the silicon wafer.

19. The method of claim 14 wherein the metal is Co, Ni, Pt or Ti.

20. The method of claim 14 wherein the resist layer is an organic resin.

* * * * *

UNITED STATES PATENT AND TRADEMARK OFFICE
CERTIFICATE OF CORRECTION

PATENT NO. : 7,022,595 B2  Page 1 of 1
APPLICATION NO. : 10/871356
DATED : April 4, 2006
INVENTOR(S) : Christophe Regnier et al.

It is certified that error appears in the above-identified patent and that said Letters Patent is hereby corrected as shown below:

Title Page
Item (57), "suicide" should read as --silicide--

Column 4
Line 57, "suicide" should read as --silicide--

Column 5
Line 31, "suicide" should read as --silicide--

Column 6
Line 9, "suicide" should read as --silicide--

Signed and Sealed this

Twenty-eighth Day of November, 2006

JON W. DUDAS
*Director of the United States Patent and Trademark Office*